US011313289B2

(12) United States Patent
Kishi et al.

(10) Patent No.: US 11,313,289 B2
(45) Date of Patent: Apr. 26, 2022

(54) POSITION SENSOR AND POSITION DETECTION METHOD

(71) Applicant: TOYO DENSO KABUSHIKI KAISHA, Tokyo (JP)

(72) Inventors: Shoji Kishi, Saitama (JP); Toshiya Yoshida, Saitama (JP); Takayuki Otani, Saitama (JP); Toshikazu Murata, Saitama (JP)

(73) Assignee: TOYO DENSO KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/027,755

(22) Filed: Sep. 22, 2020

(65) Prior Publication Data

US 2021/0254565 A1    Aug. 19, 2021

(30) Foreign Application Priority Data

Feb. 14, 2020 (JP) .............................. JP2020-022978

(51) Int. Cl.
*F02D 31/00* (2006.01)
*G01D 5/14* (2006.01)
(Continued)

(52) U.S. Cl.
CPC ............. *F02D 31/007* (2013.01); *G01D 5/14* (2013.01); *B60W 2420/503* (2013.01);
(Continued)

(58) Field of Classification Search
CPC .. F02D 31/007; F02D 2200/0404; G01D 5/14
(Continued)

(56) References Cited

U.S. PATENT DOCUMENTS

| 5,544,000 A * | 8/1996 | Suzuki ................. F02D 11/106 |
| | | 324/207.2 |
| 2013/0214767 A1* | 8/2013 | Shintani ................ F02D 41/221 |
| | | 324/207.25 |

(Continued)

FOREIGN PATENT DOCUMENTS

| DE | 43 17 259 A1 | 11/1993 |
| EP | 1 069 400 A1 | 1/2001 |

(Continued)

OTHER PUBLICATIONS

Extended European Search Report mailed by European Patent Office dated on Feb. 25, 2021 in corresponding European patent application No. 20199220.3-1010.

*Primary Examiner* — Yi-Kai Wang
(74) *Attorney, Agent, or Firm* — IP Business Solutions, LLC

(57) ABSTRACT

A position sensor of the present invention includes: a magnet that moves together with a moving body; a magnetic sensor that detects a magnetic flux generated by the magnet; and a detector that detects an anomaly of the magnetic sensor based on a detection value detected by the magnetic sensor. The magnetic sensor is set so as to detect the detection value taking a value on a locus preset in accordance with a position of the moving body, and the locus is set so that a change rate of the detection value corresponding to change of the position of the moving body differs for each of a plurality of sections set within a movement range of the moving body. The detector detects the anomaly of the magnetic sensor based on a relation between the detection value and a comparison value that is a value corresponding to the locus.

12 Claims, 11 Drawing Sheets

(51) Int. Cl.
 *G01R 15/20* (2006.01)
 *G01R 33/07* (2006.01)

(52) U.S. Cl.
 CPC ...... *F02D 2200/0404* (2013.01); *G01R 15/20* (2013.01); *G01R 33/07* (2013.01); *G05B 2219/25272* (2013.01); *G05B 2219/37094* (2013.01)

(58) Field of Classification Search
 USPC .................................................. 324/207.25
 See application file for complete search history.

(56) References Cited

U.S. PATENT DOCUMENTS

| | | | |
|---|---|---|---|
| 2019/0094008 A1 | 3/2019 | Kishi | |
| 2020/0248795 A1* | 8/2020 | Hoffmann | ............... F16H 61/12 |

FOREIGN PATENT DOCUMENTS

| | | | |
|---|---|---|---|
| EP | 3 604 773 A1 | 2/2020 |
| WO | 2018/173254 A1 | 9/2018 |

* cited by examiner

FIRST POSITION (THROTTLE FULLY CLOSED)

SECOND POSITION (THROTTLE FULLY OPEN)

POSITION SENSOR AND POSITION DETECTION METHOD

INCORPORATION BY REFERENCE

The present invention is based upon and claims the benefit of priority from Japanese patent application No. 2020-022978, filed on Feb. 14, 2020, the disclosure of which is incorporated herein in its entirety by reference.

TECHNICAL FIELD

The present invention relates to a position sensor and a position detection method for detecting the position of a moving body.

BACKGROUND ART

On a motorcycle, a driver mainly rotates a throttle grip and thereby adjusts an accelerator opening to operate an accelerator. An accelerator opening is detected by detection of the rotation angle of a throttle grip. Meanwhile, in recent years, an accelerator opening is often detected by detection of a magnetic flux generated by a magnet rotating together with a throttle grip by a magnetic sensor.

Patent Document 1 discloses an example of an accelerator opening detection device that detects an accelerator opening by using a magnetic sensor. The accelerator opening detection device disclosed by Patent Document 1 includes an accelerator opening sensor including a first sensor and a second sensor that detect the rotation angle of a handle grip. Then, the accelerator opening detection device detects an angle in a forward rotation direction, an angle in a reverse rotation direction and a neutral position of the handle grip based on outputs from the first sensor and the second sensor. To be specific, the accelerator opening detection device sets a rising start opening of an output voltage of the first sensor and a rising start opening of an output voltage of the second sensor to be different from each other, and thereby detects an angle in a forward rotation direction from the output voltage of the first sensor and detects an angle in a reverse rotation direction from the output voltage of the second sensor. Thus, the accelerator opening detection device disclosed by Patent Document 1 is configured to be able to detect angles in a plurality of rotation ranges of the handle grip, such as the forward rotation direction and the reverse rotation direction.

Further, the accelerator opening detection device disclosed by Patent Document 1 also includes a function to detect an anomaly in the sensor based on the outputs from the first sensor and the second sensor. To be specific, the accelerator opening detection device sets initial values or slopes representing changes corresponding to the angle of the handle grip to be different between a first voltage that is the output voltage of the first sensor and a second voltage that is the output voltage of the second sensor, and the accelerator opening detection device is configured to, when the first voltage is lower than the second voltage, detect occurrence of an anomaly in the sensor.

Patent Document 1: WO 2018/173254

However, the accelerator opening detection device disclosed by Patent Document 1 mentioned above may fail to detect occurrence of an anomaly in the sensor. For example, in a case where the first sensor and the second sensor are influenced by an external magnetic field simultaneously, or in a case where an anomaly occurs only in the second sensor, the first voltage does not become lower than the second voltage, and occurrence of an anomaly in the sensor cannot be detected. Then, in a case where the principles of the above accelerator opening detection device are applied not only to a handle grip from which a rotation angle is detected but also to a position sensor configured to detect positions in a plurality of movement ranges of a moving body to be detected, it is also impossible to detect occurrence of an anomaly in the sensor as described above.

SUMMARY

Accordingly, an object of the present invention is to solve the abovementioned problem that it is impossible to detect occurrence of an anomaly in a position sensor that can detect positions in a plurality of movement ranges of a moving body.

A position sensor according to an aspect of the present invention includes: a magnet configured to move together with a moving body; a magnetic sensor configured to detect a magnetic flux generated by the magnet; and a detector configured to detect an anomaly of the magnetic sensor based on a detection value detected by the magnetic sensor. The magnetic sensor is set so as to detect the detection value taking a value on a locus preset in accordance with a position of the moving body, and the locus is set so that a change rate of the detection value corresponding to change of the position of the moving body differs for each of a plurality of sections set within a movement range of the moving body. The detector is configured to detect the anomaly of the magnetic sensor based on a relation between the detection value and a comparison value that is a value corresponding to the locus.

Further, a position detection method according to another aspect of the present invention is a position detection method executed by a position sensor including a magnetic sensor that detects a magnetic flux generated by a magnet moving together with a moving body. The magnetic sensor is set so as to detect a detection value taking a value on a locus preset in accordance with a position of the moving body, and the locus is set so that a change rate of the detection value corresponding to change of the position of the moving body differs for each of a plurality of sections set within a movement range of the moving body. The position detection method includes detecting an anomaly of the magnetic sensor based on a relation between the detection value and a comparison value that is a value corresponding to the locus.

With the configurations as described above, the present invention makes it possible to detect occurrence of an anomaly in a position sensor that can detect positions in a plurality of movement ranges of a moving body.

EXAMPLE EMBODIMENTS

First Example Embodiment

Figure 6:
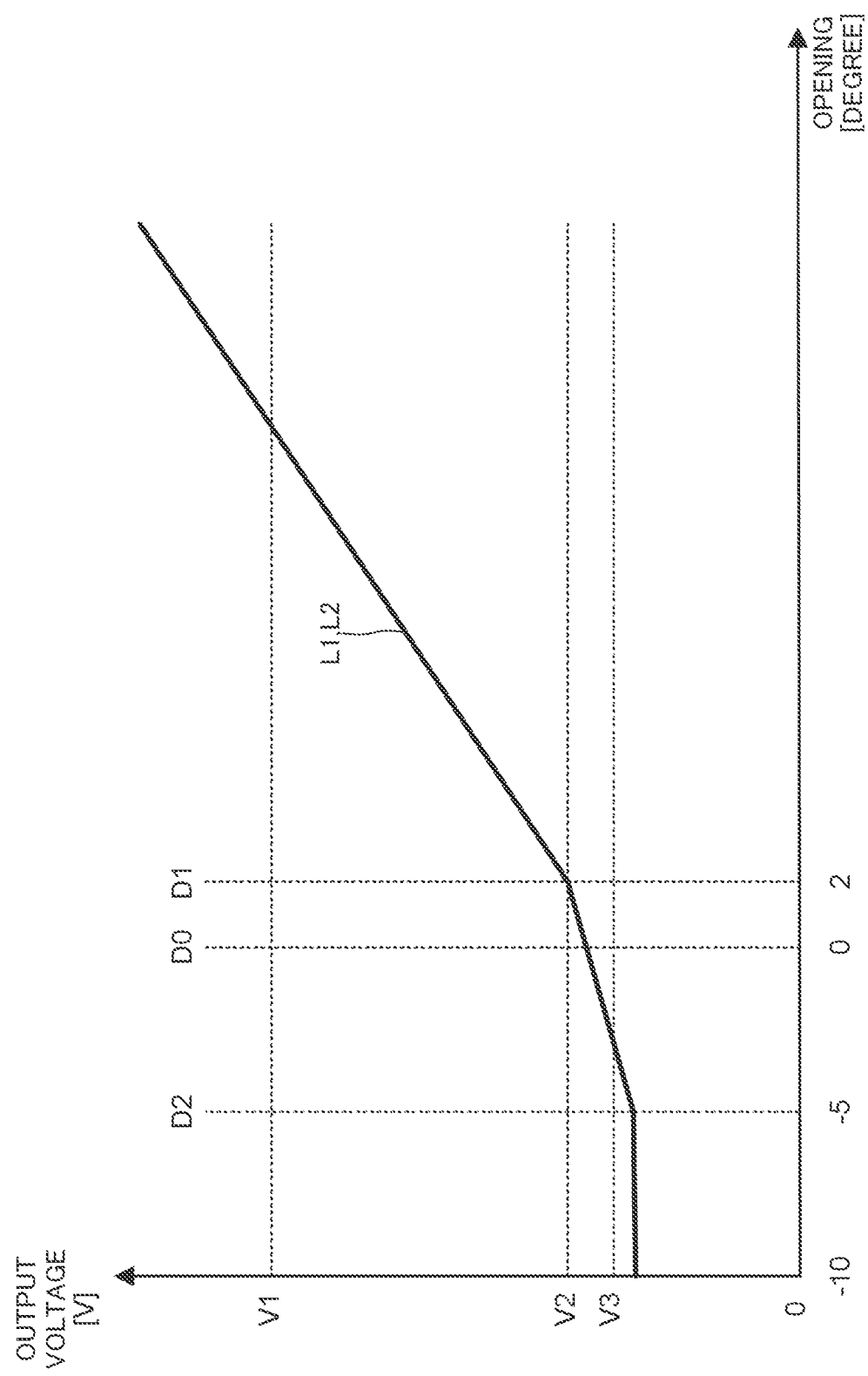
FIG. 6 is a view showing an example of detection values when magnetic sensors configuring the position sensor shown in FIG. 5 detect a magnetic flux.
Figure 7:
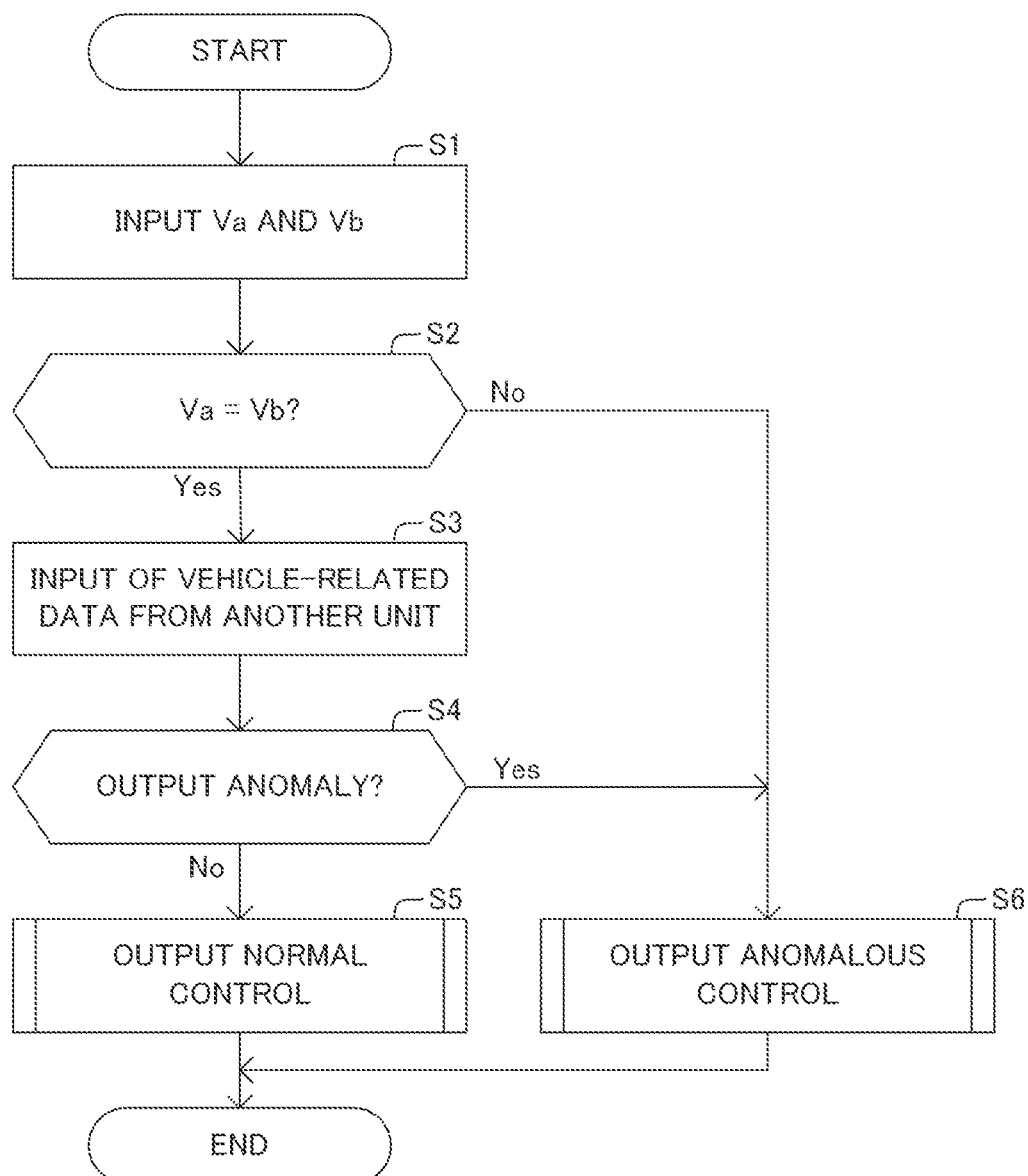
FIG. 7 is a flowchart showing an operation of the position sensor disclosed in FIG. 5.
Figure 8:
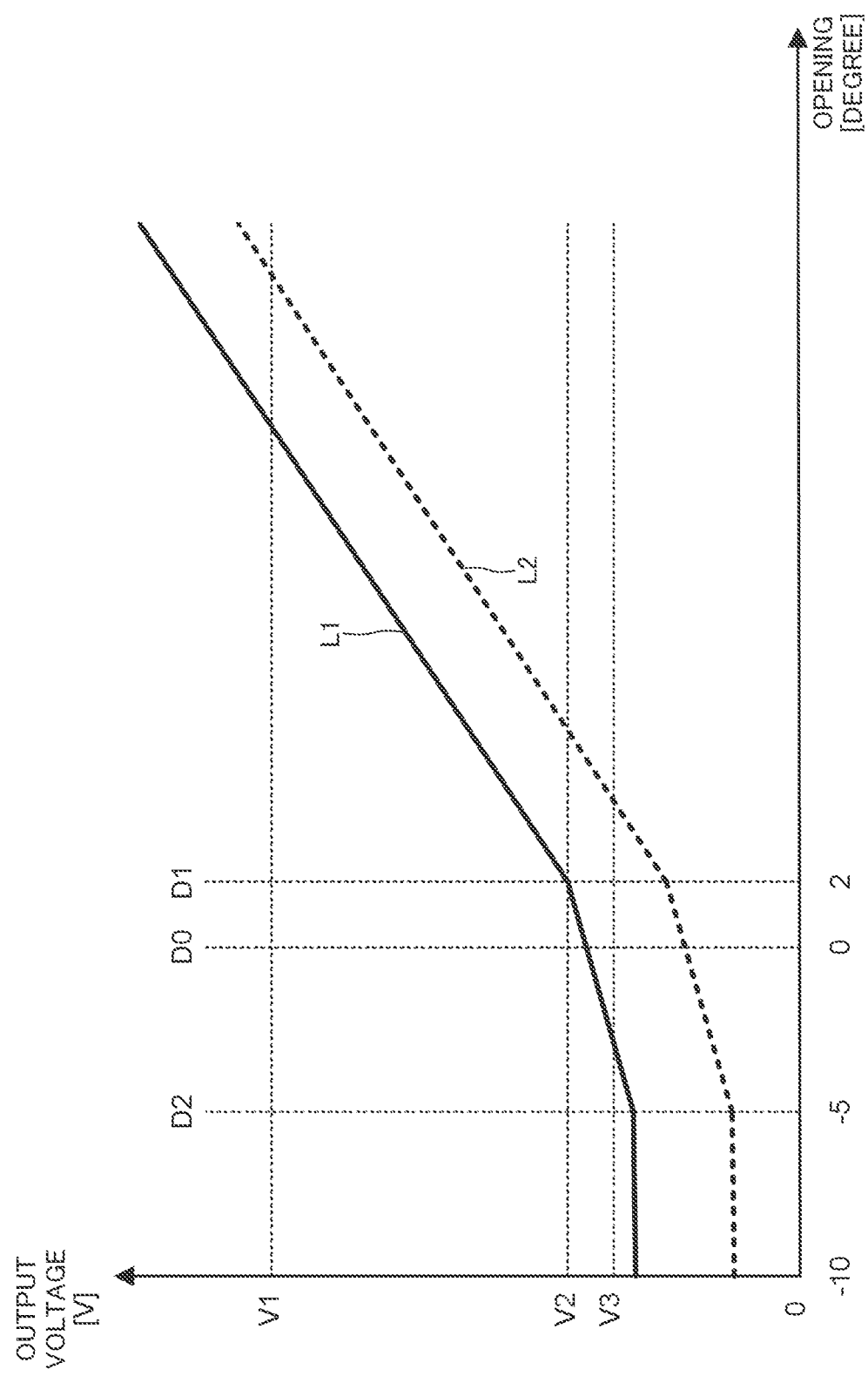
FIG. 8 is a view showing another example of detection values when the magnetic sensors configuring the position sensor shown in FIG. 5 detect a magnetic flux.
Figure 9:
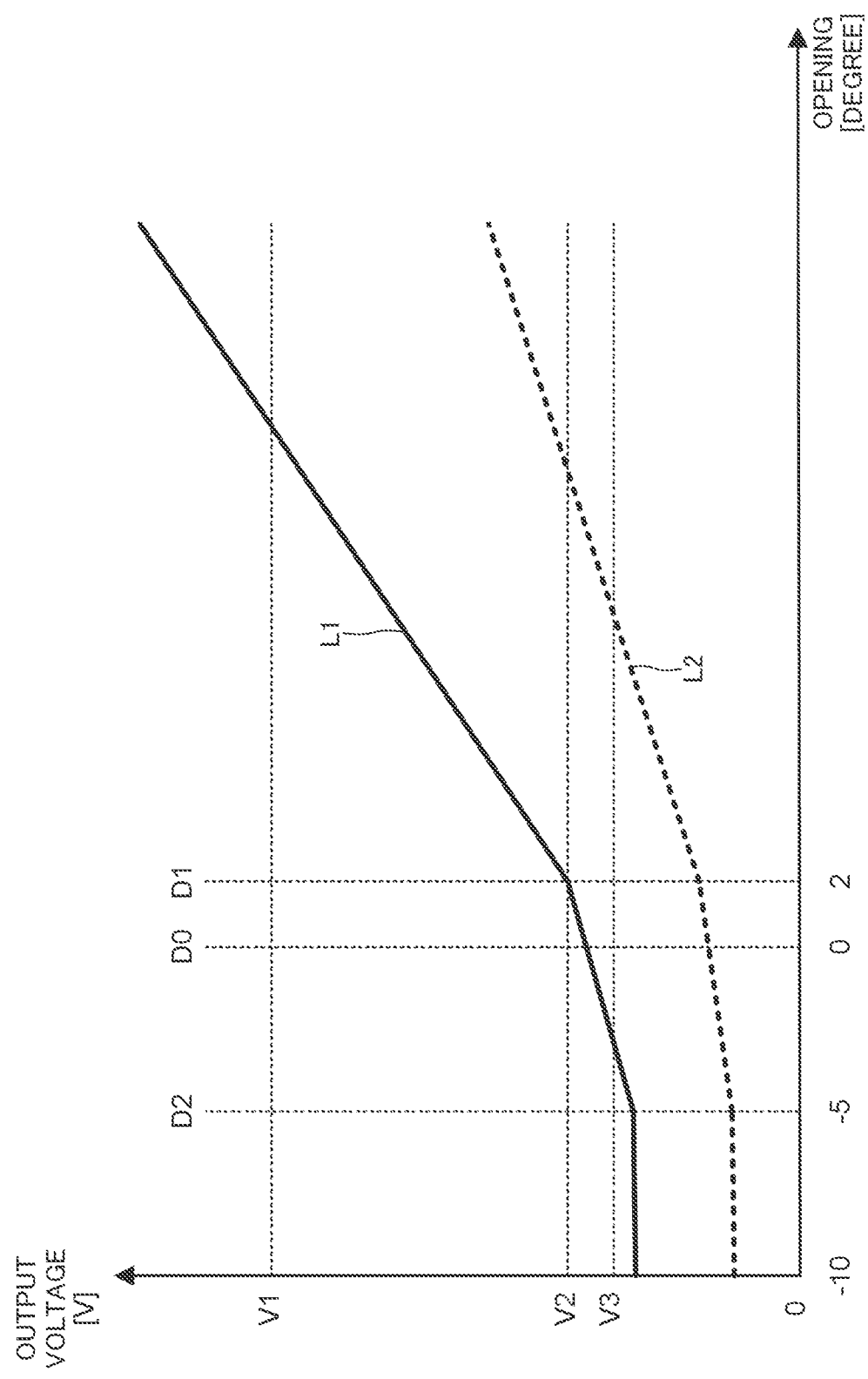
FIG. 9 is a view showing another example of detection values when the magnetic sensors configuring the position sensor shown in FIG. 5 detect a magnetic flux.
Figure 10:
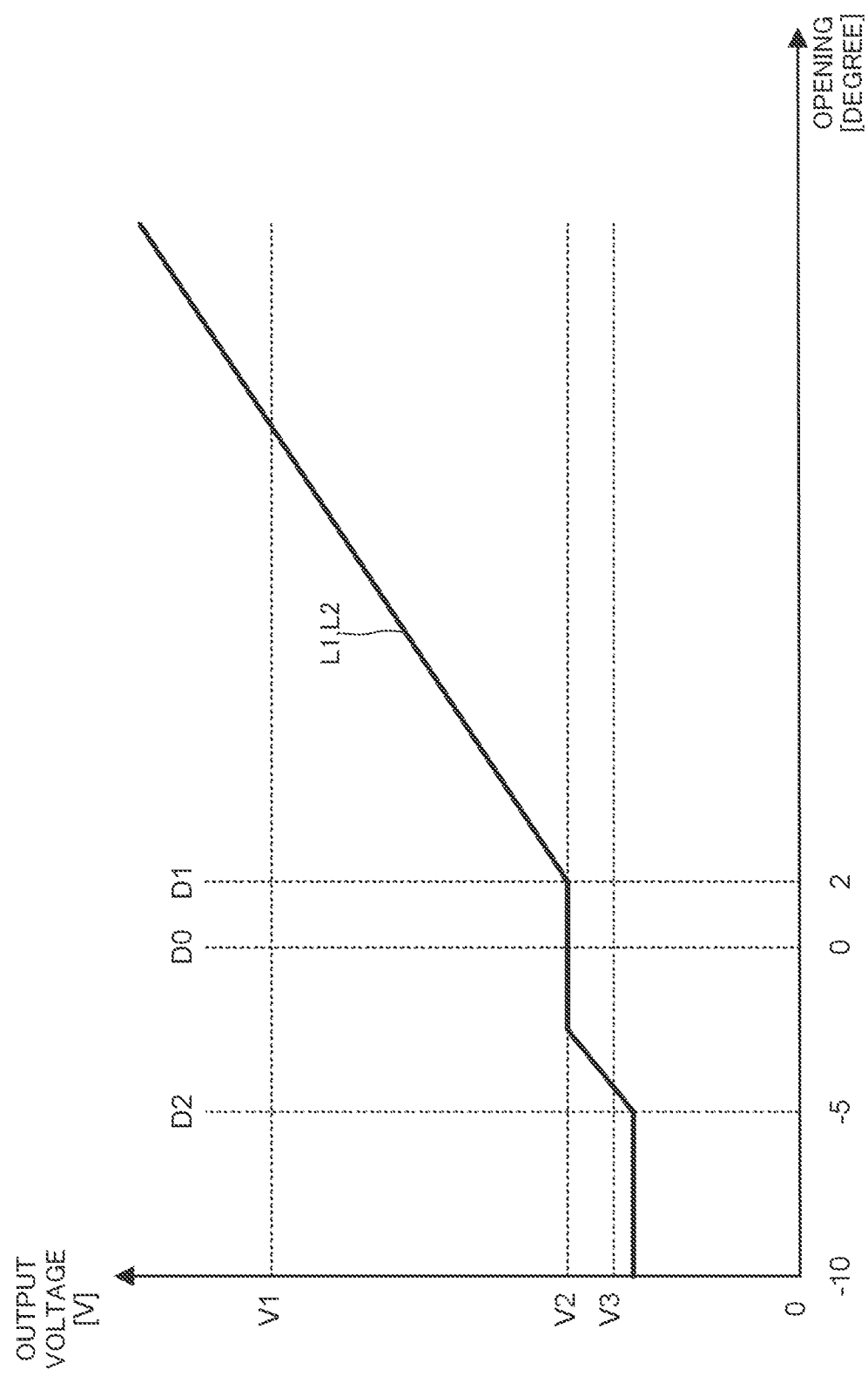
FIG. 10 is a view showing another example of detection values when the magnetic sensors configuring the position sensor shown in FIG. 5 detect a magnetic flux.

A first example embodiment of the present invention will be described with reference to FIGS. 1 to 10. FIGS. 1 to 6 are views for describing a configuration of a position sensor, and FIG. 7 is a view for describing an operation of the position sensor. FIGS. 8 to 10 are views for describing other configurations of the position sensor.

Configuration

Figure 1:
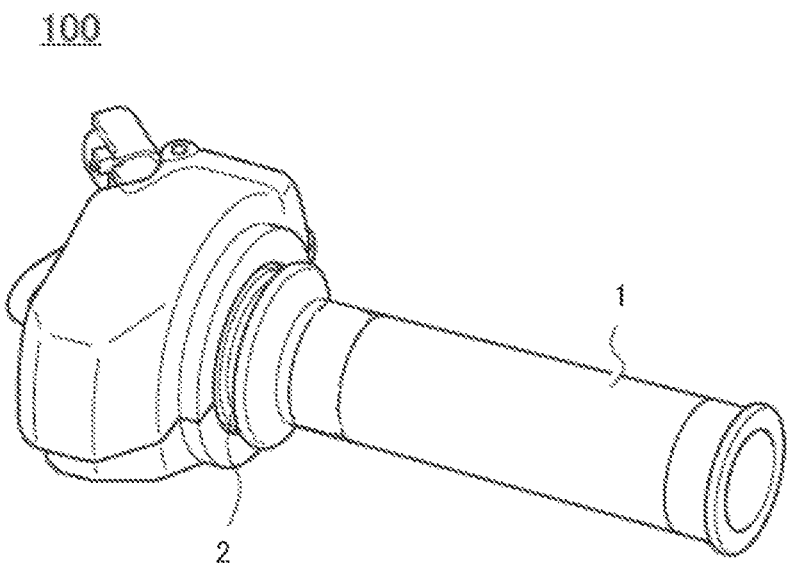
FIG. 1 is a perspective view of a throttle device in a first example embodiment of the present invention.

The position sensor in this example embodiment is a device for detecting the degree of rotation, that is, a rotation position in a rotation direction (a position) of a rotating body. Specifically, as shown in FIG. 1, the position sensor in this example embodiment is mounted on a throttle device 100 for operating an accelerator of a motorcycle and is for detecting the rotation angle of a throttle grip 1. The position sensor in this example embodiment also has a function to detect occurrence of an anomaly in the position sensor. However, the position sensor according to the present invention is not necessarily limited to being mounted on a throttle device, and may be used for detecting the rotation position of any rotating body. Moreover, the position sensor of the present invention is not limited to being used for detecting the rotation position of a rotating body, and may be used for detecting the movement position of a moving body.

Figure 2:
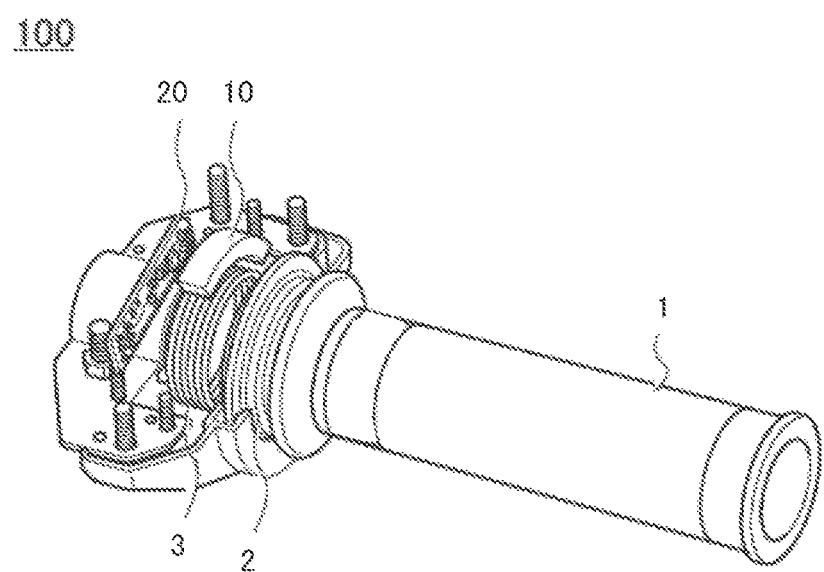
FIG. 2 is a partially cutaway perspective view of the throttle device shown in FIG. 1.

First, a major mechanism of the throttle device 100 equipped with the position sensor will be described with reference to FIGS. 1 to 4. FIG. 1 is a perspective view of the throttle device 100 in this example embodiment. FIG. 2 is a partially cutaway perspective view of the throttle device 100 shown in FIG. 1.

The throttle device 100 shown in FIG. 1 is attached onto the right side of a handle of a motorcycle. To a rotating shaft 2 of the throttle device 100, a grip 1 that is a rotating body is attached. The grip 1 is rotatable about the rotating shaft 2 among a first position, a second position and a third position, which will be described later.

The first position (a specific rotation position) refers to a position to which the grip 1 naturally returns, and is a grip position with a throttle fully closed in which a rotation angle is set to nearly 0 degree. When an operator who is a rider on the motorcycle is not operating the grip 1, the grip position is the first position, and an engine of the motorcycle is in an idle state. In this example embodiment, as shown in FIG. 6 described later, the first position is set within a predetermined range in which the rotation angle of the grip 1 is around 0 degree, for example, from −2.5 degrees to +2 degrees.

Further, the second position is a position where the operator who is the rider on the motorcycle has rotated the grip 1 in a frontward direction (a second position direction: one direction) from the first position to a position in which the grip 1 cannot be further turned, and is a grip position with the throttle fully open in which the rotation angle is a positive value. When the operator operates the grip 1 to rotate the grip 1 from the first position toward the second position, an output of the engine of the motorcycle increases as the rotation angle increases. In particular, when the operator rotates the grip 1 up to the second position, the engine of the motorcycle is in a state in which its output is increasing to the maximum output.

Further, the third position is a position where the operator who is the rider on the motorcycle has rotated the grip 1 in a traveling direction (a third position direction: a reversed rotation direction from the one direction) from the first position to a position in which the grip 1 cannot be further rotated, and is a grip position where the rotation angle is a negative value, for example, the rotation angle is −10 degrees. When the operator operates the grip 1 to rotate the grip 1 from the first position toward the third position, an operation on a specific function of the motorcycle is performed. For example, when the operator rotates the grip 1 from the first position to the third position, the operator performs an operation to cancel a cruise control function of the motorcycle.

As shown in FIG. 2, a return spring 3, a magnet 10 and a substrate 20 are provided inside the throttle device 100. The return spring 3 is connected to the grip 1, and applies a returning energizing force to the grip 1 rotating in a throttle open direction (second position direction) from the first position. Moreover, not shown in the drawings, a mechanism such as another spring that applies a returning energizing force to the grip 1 rotating from the first position in an opposite direction (third position direction) to the throttle open direction is also provided inside the throttle device 100. With this, when the operator performs an operation to rotate the grip 1 from the first position in either the second position direction or the third position direction, and thereafter, releases his/her hand from the grip 1 to stop the operation to rotate the grip 1, the grip 1 is returned to the first position due to the energizing force of the return spring 3 or the like.

The magnet 10 is coupled with the grip 1, and rotates integrally with the grip 1. Then, the magnet 10 rotates along an outer periphery of the return spring 3. The magnet 10 is a segment (C) type magnet having an arc shape. Both ends in a longitudinal direction of the magnet 10 are magnetized into the N pole and the S pole.

The substrate 20 includes a plurality of magnetic sensors, and is fixed so as to face the magnet 10. Examples of the magnetic sensor include a Hall element, a magneto-resistive effect element, a magnetic impedance element, and a superconductive quantum interference element. In this example embodiment, a Hall element is used as the magnetic sensor.

Figure 3:
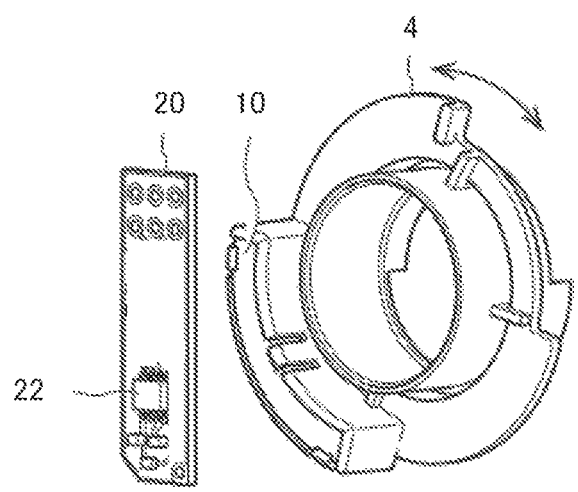
FIG. 3 is a view schematically showing a positional relation between a magnet and a substrate on a grip shown in FIG. 2.
Figure 4:
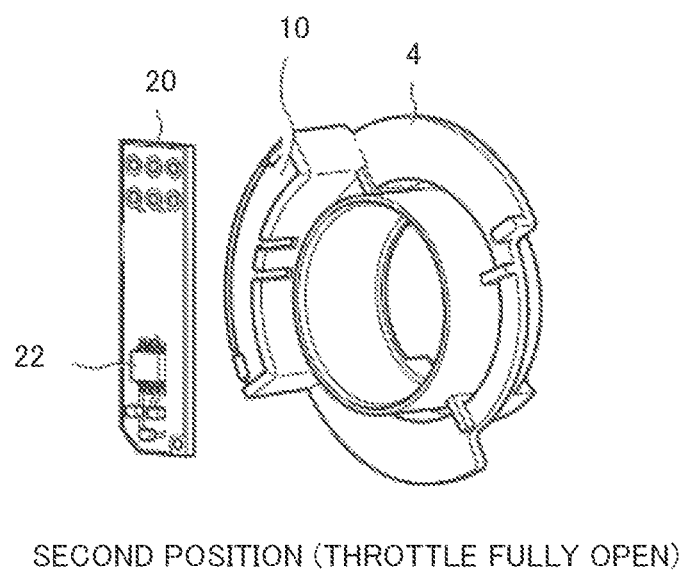
FIG. 4 is a view schematically showing a positional relation between the magnet and the substrate on the grip shown in FIG. 2.

FIG. 3 is a view schematically showing a positional relation between the magnet and the substrate in the first position of the grip 1 shown in FIG. 2. FIG. 4 is a view schematically showing a positional relation between the magnet and the substrate in the second position of the grip 1 shown in FIG. 2.

As shown in FIGS. 3 and 4, the magnet 10 is housed in a magnet holder 4. The magnet holder 4 is attached to one end of the grip 1 (see FIG. 2) coaxially with the rotating shaft 2 of the grip 1. When the grip 1 rotates, the magnet holder 4 rotates in an interlocking manner in a direction shown by an arrow in FIG. 3.

The substrate 20 is fixedly attached in a housing (not shown) of the throttle device 100 (see FIG. 2). Therefore, the magnet 10 rotates along a surface of the fixed substrate 20. Moreover, two Hall ICs 21 and 22 are attached to the substrate 20. The first Hall IC 21 (not shown in FIGS. 3 and 4) is provided on a magnet-10-side surface of the substrate 20, and the second Hall IC 22 is provided on an opposite surface to the magnet-10-side surface of the substrate 20.

As shown in FIG. 3, when the grip 1 is located in the first position with the throttle fully closed, the two Hall ICs 21 and 22 face the near-side portion of the end portion of one magnetic pole (for example, the N pole) of the magnet 10. Moreover, as shown in FIG. 4, when the grip 1 is located in the second position with the throttle fully open, the magnet 10 has rotated from the position of FIG. 3, and therefore, the two Hall ICs 21 and 22 face the other magnetic pole (for example, the S pole) side of the magnet 10. Moreover, although not shown in the drawings, when the grip 1 is located in the third position in which the grip 1 is further rotated in the traveling direction from the position with the throttle fully closed, the magnet 10 has been further rotated from the position of FIG. 3 in the opposite direction to the position of FIG. 4, so that the two Hall ICs 21 and 22 face the end portion side of the one magnetic pole (for example, the N pole) of the magnet 10.

Although not shown in the drawings, Hall elements are provided in the two Hall ICs 21 and 22, respectively. Therefore, the two Hall elements are fixed to the substrate 20 so as to face the magnet 10. The two Hall elements are provided on the front and rear surfaces of the substrate 20, respectively. The Hall elements are placed so that, when an external magnetic field (for example, a ferromagnetic field) acts in a state in which the grip 1 is located in the first position with the throttle fully closed, the densities of magnetic fluxes applied to the two Hall elements, respectively, have a difference. To be specific, in order to make the intensities of a magnetic field applied from the magnet 10 different, the two Hall elements are placed to be mutually offset in two directions; a direction of magnetic field lines of the magnetic field and a direction intersecting the direction of the magnetic field lines. By thus placing the Hall elements, one of the Hall elements is easily influenced by an external magnetic field than the other Hall element. When an external magnetic field acts on the two Hall elements, the outputs of the respective Hall elements vary largely.

Offsetting the two Hall elements in the direction of the magnetic field lines of the magnetic field corresponds to making the positions of the two Hall elements different from each other on a plane of the substrate 20. Offsetting the two hall elements in the direction intersecting with the direction of the magnetic field lines corresponds to placing the two Hall elements on the front surface and the rear surface, respectively, so as to make the positions of the Hall elements different from each other by using the thickness of the substrate 20.

Next, with reference to the block diagram of FIG. 5, a configuration of the abovementioned position sensor mounted on the throttle device 100 will be described. The position sensor includes the abovementioned magnet 10 and the substrate 20 including the first sensor 21 and the second sensor 22 that are configured by two Hall ICs including the Hall elements, respectively. The substrate 20 is connected to an ECU (Engine Control Unit) 30 mounted on a vehicle that is the motorcycle, and is supplied with power. The substrate 20 includes the first sensor 21 and the second sensor 22 as mentioned above, and includes amplifiers 23 and 24 that amplify voltage values that are detected values by the first sensor 21 and the second sensor 22, respectively. The substrate 20 is connected to the ECU 30 via a signal line, and is configured to be able to input voltage values Va and Vb detected by the first sensor 21 and the second sensor 22 and amplified by the amplifiers 23 and 24, into the ECU 30.

The respective amplifiers 23 and 24 are configured to amplify the detection value detected by the first sensor 21 (a first detection value) and the detection value detected by the second sensor 22 (a second detection value) so that a relation between the respective detection values is a preset relation. That is to say, the detection values detected by the first sensor 21 and the second sensor 22 are set so as to become values having a preset relation in accordance with the rotation angle of the magnet 10 by the functions of the amplifiers 23 and 24. For example, the respective detection values by the first sensor 21 and the second sensor 22 are set so as to become identical values in the case of the rotation angles of the magnet 10 being identical values. That is to say, the detection values by the first sensor 21 and the second sensor 22 are set so as to become values on identical loci previously set in accordance with the rotation angle of the magnet 10 as indicated by reference symbols L1 and L2 in FIG. 6 by the functions of the amplifiers 23 and 24. Meanwhile, the loci L1 and L2 of the detection values by the first sensor 21 and the second sensor 22 are not limited to being completely identical. The loci L1 and L2 may have a difference within a preset range, and may be substantially identical.

A plurality of sections are set in a range of the rotation angle of the magnet 10, and change rates of the detection values by the first and second sensors 21 corresponding to change of the rotation angle of the magnet 10 are set so as to be different for each of the sections. For example, in this example embodiment, as shown in FIG. 6, it is assumed that a first section of −10 degrees to −5 degrees (a section less than D2), a second section of −5 degrees to +2 degrees (a section equal to or more than D2 and less than D1), and a third section of equal to or more than +2 degrees (a section equal to or more than D1) are set as the sections of the rotation angle of the magnet 10. The second section is a section that includes the first position of the grip and also includes location on the third position side. In the first section, the change rates of the detection values are 0, that is, constant values. In the second section, the change rates are each set to a change rate a such that the detection values increase as the rotation angle increases. In the third section, the change rates are each set to a change rate b such that the detection values increase as the rotation angle increases. The change rate b of the third section, that is, the slope b thereof is set to be larger than the change rate a of the second section, that is, the slope a thereof. Thus, the loci L1 and L2 of the detection values by the first sensor 21 and the second sensor 22 are set so that the change rates of the detection values according to change of the rotation angle of the magnet 10 vary for each of the set sections.

Further, the substrate 20 includes an anomaly detection circuit 25 (detector) configured by an electronic circuit. The anomaly detection circuit 25 has a function to detect occurrence of an anomaly in the first sensor 21 or the second sensor 22 by using voltage values that are detection values detected by the first sensor 21 and the second sensor 22. To be specific, the anomaly detection circuit 25 converts the detection values detected by the first sensor 21 and the second sensor 22 into the voltage values Va and Vb so that the detection values become amplified values in the same manner as the amplifiers 23 and 24 mounted on the substrate 20, and examines the presence/absence of change in the relation between the voltage values Va and Vb. Herein, as the relation between the voltage values Va and Vb, a relation such that both the voltage values take identical loci, that is, identical values is set. Therefore, the anomaly detection circuit 25 checks whether the relation is satisfied or not. In a case where the voltage values Va and Vb are different values and do not satisfy the relation such that the voltage values take identical values, that is, the preset relation has changed, the anomaly detection circuit 25 detects occurrence of an anomaly in the first sensor 21 or the second sensor 22. An anomaly is, for example, a failure of one of the sensors or occurrence of an external magnetic field. In particular, in this example embodiment, as mentioned above, the first sensor 21 and the second sensor 22 are placed with an offset, and therefore, when an external magnetic field which is different from a magnetic flux from the magnet 10 occurs, the detection values vary greatly. Consequently, occurrence of an external magnetic field can also be detected.

Since the loci L1 and L2 of the detection values detected by the first sensor 21 and the second sensor 22 are substantially identical, even if the voltage values Va and Vb are different values, the anomaly detection circuit 25 does not detect occurrence of an anomaly when the difference between the voltage values is within a range that can be determined to be substantially identical. That is to say, the anomaly detection circuit 25 detects occurrence of an anomaly when the voltage values Va and Vb are different values and the difference therebetween is outside a preset range.

Then, the anomaly detection circuit 25 controls the output of the voltage values Va and Vb detected by the first sensor 21 and the second sensor 22, depending on the presence/absence of occurrence of an anomaly. For example, when not detecting occurrence of an anomaly, the anomaly detection circuit 25 does not engage in the output of the voltage values Va and Vb to the ECU 30. As a result, the substrate 20 outputs the voltage values Va and Vb detected by the first sensor 21 and the second sensor 22 to the ECU 30, and the ECU 30 detects a throttle opening corresponding to the voltage values and performs throttle control for the detected throttle opening. That is to say, the ECU 30 functions as a sensor that detects the rotation angle of the grip 1, that is, the magnet 10. In this example embodiment, the voltage values Va and Vb detected by the first sensor 21 and the second sensor 22 are identical values, and therefore, the ECU 30 may use either of the voltage values, for example, the voltage value Va detected by the first sensor 21 to detect a throttle opening and perform throttle control.

In a case where the grip 1 is located closer to the second position than to the first position described above and the voltage value is a voltage value V1 corresponding to the rotation angle of equal to or more than +2 degrees as shown in FIG. 6, the ECU 30 performs control so that the output of the engine of the motorcycle increases as the rotation angle increases. In a case where the grip is located in the abovementioned first position and the voltage value is within a range of a voltage value V2 to a voltage value V3 corresponding to the rotation angle of −2.5 degrees to +2 degrees as shown in FIG. 6, the ECU 30 performs idling control. In a case where the grip is located closer to the third position than to the first position described above and the voltage value is equal to or less than the voltage value V3 corresponding to the rotation angle of equal to or less than −2.5 degrees, the ECU 30 performs control to cancel the cruise control function. In a case where the voltage value detected by the first sensor 21 is V1, that is, located in the abovementioned third section, the change rate b of the detection value is set to be large as compared with the change rate of the other sections. Therefore, the resolution with respect to the detected value is high, and the output of the engine can be controlled more accurately according to the rotation angle of the grip 1.

On the other hand, when detecting occurrence of an anomaly, the anomaly detection circuit 25 outputs anomaly signals to the amplifiers 23 and 24, for example. Thus, the amplifiers 23 and 24 set the voltage values Va and Vb detected by the first sensor 21 and the second sensor 22 to LOW level, and output to the ECU 30. Consequently, the ECU 30 executes control set in case of anomaly detection such as the throttle control being stopped. Meanwhile, when detecting occurrence of an anomaly, the anomaly detection circuit 25 may output an anomaly signal directly to the ECU 30 or another device, or may perform another process to notify the anomaly.

Operation

Next, an operation of the abovementioned position sensor will be described mainly with reference to the flowchart of FIG. 7. First, the first sensor 21 and the second sensor 22 detect at all times the directions of magnetic fluxes generated by the magnet 10 rotating in conjunction with the rotation of the throttle grip 1, and output the detection values to the anomaly detection circuit 25. The anomaly detection circuit 25 converts the detection values detected by the first sensor 21 and the second sensor 22 into the voltage values Va and Vb so that the detection values become amplified values in the same manner as the amplifiers 23 and 24 mounted on the substrate 20, and inputs the voltage values Va and Vb (step S1).

Then, the anomaly detection circuit 25 checks change in the relation between the voltage values Va and Vb. To be specific, the anomaly detection circuit 25 checks whether the relation that the voltage values Va and Vb are values on identical loci, that is, the values substantially coincide is satisfied or not (step S2). In a case where the voltage values Va and Vb are substantially identical values (Yes at step S2), the anomaly detection circuit 25 does not detect occurrence of an anomaly. In this case, the voltage values Va and Vb obtained by amplifying the detection values detected by the first sensor 21 and the second sensor 22 by the amplifiers 23 and 24 are output from the substrate 20 to the ECU 30.

Subsequently, the ECU 30 receives input of vehicle-related data such as vehicle speed and a predetermined vehicle signal from another unit, (step S3), and determines based on the data whether or not the accelerator position sensor output is anomalous (Step S4). When the ECU 30 determines that the accelerator position sensor output is not anomalous (No at step S4), the ECU 30 performs output normal control (step S5). For example, as the output normal control, the ECU 30 detects a throttle opening corresponding to one of the voltage values Va and Vb output from the substrate 20, and performs throttle control for the throttle opening.

On the other hand, in a case where the preset relation is not satisfied, for example, the voltage values Va and Vb are not substantially identical values (No at step S2), the anomaly detection circuit 25 detects occurrence of an anomaly. In this case, for example, the anomaly detection circuit 25 outputs anomaly signals to the amplifiers 23 and 24, the anomaly signals are transmitted from the amplifiers 23 and 24 to the ECU 30, and the ECU 30 performs the output anomaly control (step S6). For example, the ECU 30 performs the output anomaly control set in case of detection of occurrence of an anomaly such as the throttle control being stopped.

Thus, in this example embodiment, first, the loci of the detection values corresponding to the rotation angle of the magnet 10 detected by the first sensor 21 and the second sensor 22 that are magnetic sensors are set in advance, and are also set so that change rates vary in each of a plurality of sections of a range where the magnet 10 rotates. Therefore, from the detection values detected by the magnetic sensors, a position in each of the sections where the magnet 10 rotates can be detected with accuracy suitable for each of the sections. Moreover, a relation is set in advance between the detection values detected by the first sensor 21 and the second sensor 22, and it is possible, by comparing the detection values having been detected with each other and checking whether or not the relation is satisfied, to detect whether or not an anomaly has occurred in the magnetic sensors. As a result, occurrence of an anomaly can be detected in the entire rotation range of the magnet 10, that is, the grip 1.

Modification Example

In the above description, a case in which as the relation between the detection values detected by the first sensor 21 and the second sensor 22, a relation such that in the case of the rotation angle of the magnet 10 being identical, both the detection values are substantially identical values, that is, both the detection values are values on the identical loci L1 and L2 as shown in FIG. 6 is set by the functions of the amplifiers 23 and 24 has been illustrated. Meanwhile, another relation may be set. For example, as shown in FIG. 8, as the relation between the detection values detected by the first sensor 21 and the second sensor 22, a relation such that the detection values are values on the mutually parallel loci L1 and L2 may be set by the functions of the amplifiers 23 and 24. In other words, although the loci L1 and L2 do not coincide, the change rates of the respective detection values are set to be identical in each of the abovementioned sections. To be specific, in the example of FIG. 8, first, the locus L1 of the detection value detected by the first sensor 21 is identical to that of the example of FIG. 6 described above. The locus L2 of the detection value detected by the second sensor 22 is set so as to have lower values as a whole than the values of the locus L1 of the first sensor 21, and a relation such that in the case of the rotation angle of the magnet 10 being identical, the difference between the detection values detected by the first sensor 21 and the second sensor is constant is set. However, the loci L1 and L2 of the detection values detected by the first sensor 21 and the second sensor 22 are not limited to being completely parallel to each other, and may be substantially parallel. That is to say, the difference between the detection values detected by the first sensor 21 and the second sensor 22 with respect to the identical rotation angle of the magnet 10 may be a difference within a preset range.

In the case of the abovementioned loci L1 and L2 shown in FIG. 8, the anomaly detection circuit 25 checks whether or not the difference of voltage values that are the detection values detected by the first sensor 21 and the second sensor 22 is a preset constant value (or value within a specific range). When not a constant value (or not within the specific range), the anomaly detection circuit 25 detects occurrence of an anomaly. Meanwhile, in the case of not detecting occurrence of an anomaly, the ECU 30 may detect the rotation angle of the magnet 10 based on the detection value detected by either one of the sensors.

Further, as the relation between the detection value detected by the first sensor 21 and the detection value detected by the second sensor 22, a relation as shown in FIG. 9 may be set by the functions of the amplifiers 23 and 24. To be specific, in the example of FIG. 9, first, the locus L1 of the detection value detected by the first sensor 21 is identical to that of the example of FIG. 6 described above. The locus L2 of the detection value detected by the second sensor 22 is set to have lower values as a whole than those of the locus L1 of the first sensor 21, and a relation such that in the case of the rotation angle of the magnet 10 being identical, the detection value detected by the second sensor is ½ of the detection value detected by the first sensor 21 is set. That is to say, in the second section and the third section in which the slopes of the loci L1 and L2 are take positive values, a relation such that the change rate of the detection value by the second sensor is ½ of the change rate of the detection value by the first sensor 21 is set. However, the loci L1 and L2 of the detection values detected by the first sensor 21 and the second sensor 22 are not limited to being set so that the detection value detected by the second sensor 22 is completely ½ of the detection value detected by the first sensor 21. The detection value detected by the second sensor 22 may be substantially ½ of the detection value detected by the first sensor 21.

In the case of the loci L1 and L2 shown in FIG. 9 described above, the anomaly detection circuit 25 checks whether or not a voltage value that is the detection value detected by the second sensor 22 is substantially ½ of a voltage value that is the detection value detected by the first sensor 21. When not ½, the anomaly detection circuit 25 detects occurrence of an anomaly. Meanwhile, when not detecting occurrence of an anomaly, the ECU 30 may detect the rotation angle of the magnet 10 based on the detection value detected by either one of the sensors.

In the examples shown in FIGS. 6, 8 and 9, the loci L1 and L2 of the detection values detected by the first sensor 21 and the second sensor 22 are set so that the change rates of the detection values according to change of the rotation angle of the magnet 10 change at two change points, that is, a change point between the first section and the second section and a change point between the second section and the third section, but such a change point is not limited to two. For example, the number of change points on the loci L1 and L2 may be one point, or may be three or more points. As an example, the example shown in FIG. 10 shows a case where the loci L1 and L2 of the detection values detected by the first sensor 21 and the second sensor 22 are almost identical and have three change points of the change rates. To be specific, in the example of FIG. 10, in addition to the change point between the first section and the second section and the change point between the second section and the third section as shown in FIG. 6, a new change point of the change rate is set in a position where the rotation angle of the magnet 10 is −2.5 degrees in the second section. Even in a case where the loci L1 and L2 of the detection values detected by the first sensor 21 and the second sensor 22 are not substantially identical as shown in FIGS. 8 and 9, the number of change points on the loci L1 and L2 may be one point or three or more points.

In this example embodiment, the relation between the detection value detected by the first sensor 21 and the detection value detected by the second sensor 22 set by the functions of the amplifiers 23 and 24 is not limited to the abovementioned relations, and may be any relation. The anomaly detection circuit 25 compares the detection values detected by the respective sensors 21 and 22 and, when a preset relation is not satisfied, detects occurrence of an anomaly.

Further, in this example embodiment, by comparing the detection value detected by the first sensor 21 and the detection value detected by the second sensor 22, it is checked whether or not a relation set between these values is satisfied. Meanwhile, by detecting a magnetic flux from the magnet 10 only with the first sensor 21, occurrence of an anomaly may be detected based on the detected value. For example, a magnetic flux from the magnet 10 is detected only by the first sensor 21, and the detection values are set so as to take a preset locus in accordance with the angle of the magnet 10. Then, the anomaly detection circuit 25 may check the relation between the detection value detected by the first sensor 21 and a preset comparison value, and detect occurrence of an anomaly based on the relation. As an example, the comparison value may be a value detected by another sensor that detects a value corresponding to the angle of the magnet 10, such as an encoder or a photocoupler. By checking whether or not the detection value detected by the first sensor 21 and the detection value detected by the other sensor satisfy a preset relation, it is possible to detect occurrence of an anomaly.

Figure 5:
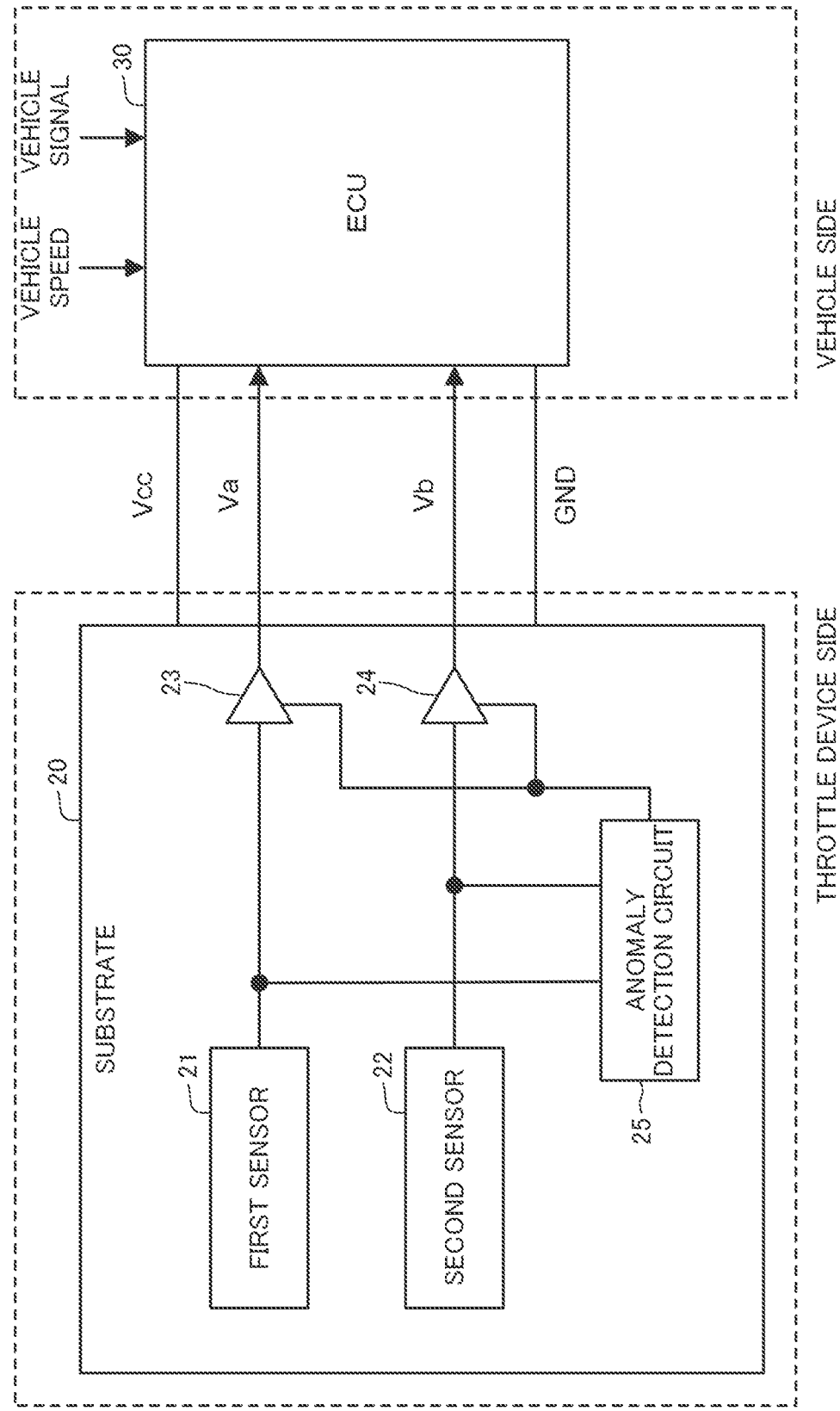
FIG. 5 is a block diagram showing a configuration of a position sensor in the first example embodiment.
Figure 11:
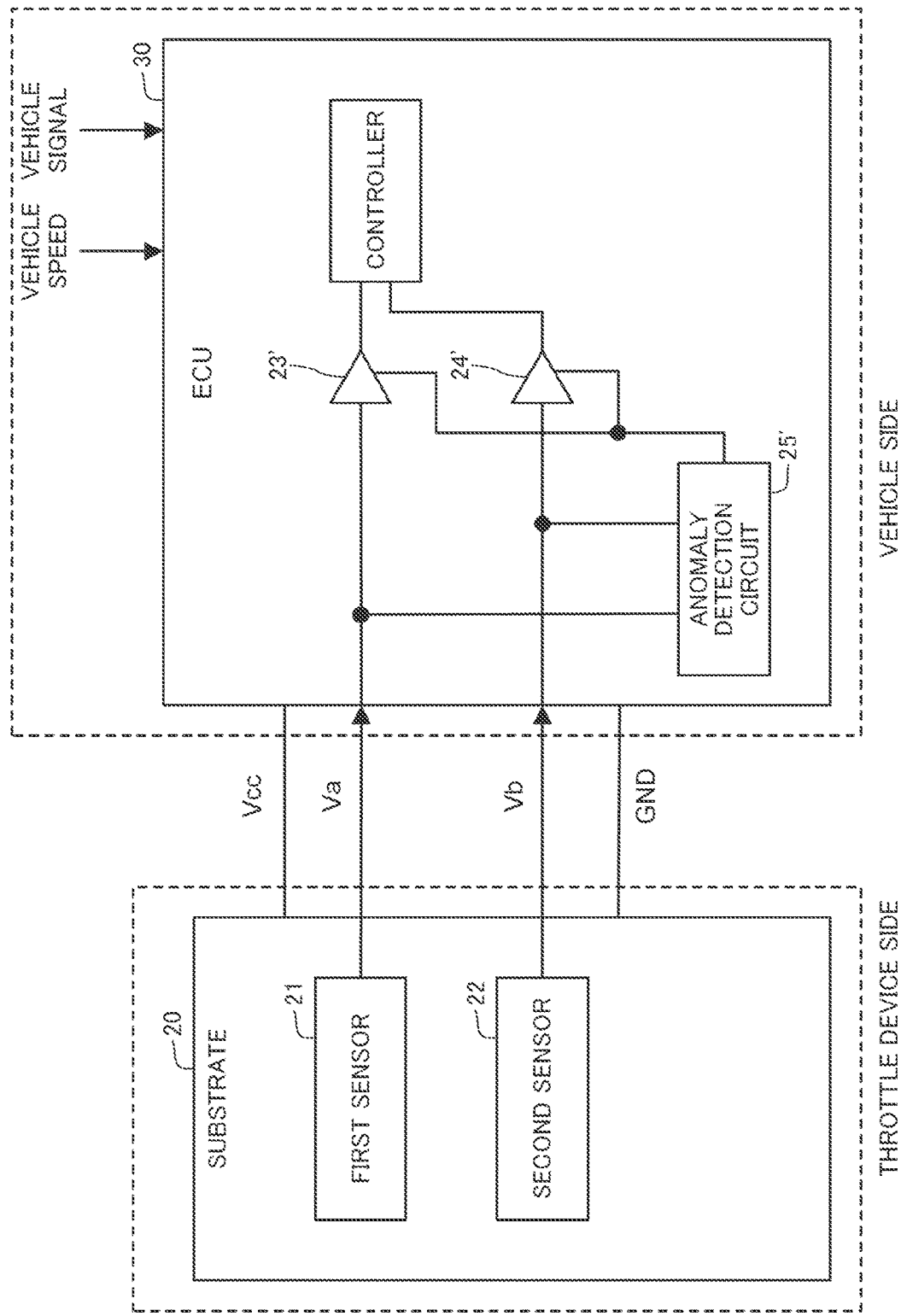
FIG. 11 is a block diagram showing another configuration of the position sensor disclosed in FIG. 5.

The functions of the amplifiers 23 and 24 and the anomaly detection circuit 25 shown in FIG. 5 may be included by the ECU 30 as indicated by reference numerals 23', 24' and 25' of FIG. 11. Moreover, in the above description, the anomaly detection circuit 25 converts the detection values detected by the first sensor 21 and the second sensor 22 into the voltage values Va and Vb that are values amplified by the amplifiers 23 and 24, and checks the presence/absence of change in the relation between the voltage values Va and Vb. Meanwhile, by using the voltage values Va and Vb amplified by the amplifiers 23 and 24, the anomaly detection circuit 25 may check the presence/absence of change in the relation between the values and detect occurrence of an anomaly.

Further, in the above description, a configuration to detect occurrence of anomaly of a magnetic sensor or the like in a position sensor detecting the rotation angle of a rotating body such as the throttle grip 1 has been illustrated. Meanwhile, the configuration is not limited to the position sensor detecting a position in a rotation direction, and is also applicable to a position sensor detecting a position of a moving body moving in all directions. For example, by replacing the rotating direction of the magnet 10 with a linear direction, even when detecting the position of a moving body moving in the linear direction, it is possible to detect the moving position and detect occurrence of an anomaly.

SUPPLEMENTARY NOTES

The whole or part of the example embodiments disclosed above can be described as the following supplementary notes. Below, the overview of the position sensor and the position detection method according to the present invention will be described. However, the present invention is not limited to the following configurations.

Supplementary Note 1

A position sensor comprising:
a magnet configured to move together with a moving body;
a magnetic sensor configured to detect a magnetic flux generated by the magnet; and
a detector configured to detect an anomaly of the magnetic sensor based on a detection value detected by the magnetic sensor, wherein:
the magnetic sensor is set so as to detect the detection value taking a value on a locus preset in accordance with a position of the moving body, and the locus is set so that a change rate of the detection value corresponding to change of the position of the moving body differs for each of a plurality of sections set within a movement range of the moving body; and
the detector is configured to detect the anomaly of the magnetic sensor based on a relation between the detection value and a comparison value that is a value corresponding to the locus.

According to the present invention, first, a locus of a detection value corresponding to a position of a moving body detected by a magnetic sensor is set in advance, and the locus is set so that a change rate of the detection value differs for each of a plurality of sections where the moving body moves. Therefore, it is possible to detect a position in each of the sections where the moving body moves with appropriate accuracy for each of the sections from the detection value detected by the magnetic sensor. Moreover, since an anomaly of the magnetic sensor is detected based on a relation between the detection value detected by the magnetic sensor and a comparison value corresponding to a locus that can be taken by the detection value, it is possible to detect an anomaly in the entire movement range of the moving body.

Supplementary Note 2

The position sensor according to Supplementary Note 1, wherein
the detector is configured to detect the anomaly of the magnetic sensor when a preset relation between the detection value and the comparison value changes.

Supplementary Note 3

The position sensor according to Supplementary Note 1, further comprising another magnetic sensor configured to detect a magnetic flux generated by the magnet, the other magnetic sensor being different from the magnetic sensor, wherein:
the other magnetic sensor is set so as to detect a second detection value taking a value on a second locus preset in accordance with the position of the moving body, and the second locus is set so as to have a preset relation with the locus for each of the sections; and
the detector is configured to detect the anomaly of the magnetic sensor based on a relation between a first detection value that is the detection value detected by the magnetic sensor and the second detection value detected by the other magnetic sensor.

Supplementary Note 4

The position sensor according to Supplementary Note 3, wherein:
the second locus is set so that a change rate of the second detection value is substantially identical to the change rate of the first detection value for each of the sections; and
the detector is configured to detect the anomaly of the magnetic sensor based on the relation between the first detection value and the second detection value.

Supplementary Note 5

The position sensor according to Supplementary Note 4, wherein:

the second locus is set to be identical or parallel to the locus; and the detector is configured to detect the anomaly of the magnetic sensor when a preset relation between the first detection value and the second detection value changes.

Supplementary Note 6

The position sensor according to Supplementary Note 1, wherein:

the moving body is a rotating body; and the magnetic sensor is set to detect the detection value taking the value on the locus in accordance with a rotation angle of the rotating body, and the locus is set so that a change rate of the detection value corresponding to change of the rotation angle of the rotating body differs for each of a plurality of sections set within a rotation range of the rotating body

Supplementary Note 7

The position sensor according to Supplementary Note 6, further comprising another magnetic sensor configured to detect a magnetic flux generated by the magnet, the other magnetic sensor being different from the magnetic sensor, wherein:

the other magnetic sensor is set so as to detect a second detection value taking a value on a second locus preset in accordance with the rotation angle of the rotating body, and the second locus is set so as to have a preset relation with the locus for each of the sections; and the detector is configured to detect the anomaly of the magnetic sensor based on a relation between a first detection value that is the detection value detected by the magnetic sensor and the second detection value detected by the other magnetic sensor.

Supplementary Note 8

The position sensor according to Supplementary Note 7, wherein:

as the sections, at least a range of a rotation angle in one direction with reference to a specific rotation position of the rotating body and a range of a rotation angle in a reversed rotation direction from the one direction with reference to the specific rotation position are set;

the locus and the second locus are set so that the change rate of the first detection value and the change rate of the second detection value are substantially identical for each of the sections; and the detector is configured to detect the anomaly of the magnetic sensor based on the relation between the first detection value and the second detection value.

Supplementary Note 9

The position sensor according to Supplementary Note 8, wherein the locus and the second locus are set so as to have a change point where the change rate of the first detection value and the change rate of the second detection value change for each of the sections.

Supplementary Note 10

The position sensor according to Supplementary Note 8, wherein the second locus is set to be identical or parallel to the locus; and the detector is configured to detect the anomaly of the magnetic sensor when a preset relation between the first detection value and the second detection value changes.

Supplementary Note 11

The position sensor according to Supplementary Note 10, further comprising a sensor configured to detect the rotation angle of the rotating body in each of the sections based on at least one of the first detection value and the second detection value

Supplementary Note 12

The position sensor according to any of Supplementary Notes 6 to 11, wherein the rotating body is a throttle grip of a vehicle.

Supplementary Note 13

A position detection method executed by a position sensor including a magnetic sensor, the magnetic sensor detecting a magnetic flux generated by a magnet moving together with a moving body, wherein the magnetic sensor is set so as to detect a detection value taking a value on a locus preset in accordance with a position of the moving body, and the locus is set so that a change rate of the detection value corresponding to change of the position of the moving body differs for each of a plurality of sections set within a movement range of the moving body, the position detection method comprising detecting an anomaly of the magnetic sensor based on a relation between the detection value and a comparison value that is a value corresponding to the locus.

Supplementary Note 14

The position detection method according to Supplementary Note 13, wherein:

the position sensor further includes another magnetic sensor detecting a magnetic flux generated by the magnet, the other magnetic sensor being different from the magnetic sensor; and the other magnetic sensor is set so as to detect a second detection value taking a value on a second locus preset in accordance with the position of the moving body, and the second locus is set so as to have a preset relation with the locus for each of the sections, the position detection method comprising detecting the anomaly of the magnetic sensor based on a relation between a first detection value that is the detection value detected by the magnetic sensor and the second detection value detected by the other magnetic sensor.

Supplementary Note 15

The position detection method according to Supplementary Note 14,
wherein the second locus is set so that a change rate of the second detection value is substantially identical to the change rate of the first detection value for each of the sections,
the position detection method comprising detecting the anomaly of the magnetic sensor based on the relation between the first detection value and the second detection value.

Supplementary Note 16

The position detection method according to Supplementary Note 15,
wherein the second locus is set to be identical or parallel to the locus,
the position detection method comprising detecting the anomaly of the magnetic sensor when a preset relation between the first detection value and the second detection value changes.

Although the present invention has been described above with reference to the example embodiments and so on, the present invention is not limited to the example embodiments. The configurations and details of the present invention can be changed in various manners that can be understood by one skilled in the art within the scope of the present invention.

DESCRIPTION OF NUMERALS 1 throttle grip
2 rotation axis
3 return spring
4 magnet holder
10 magnet
20 substrate
21 first sensor (Hall IC)
22 second sensor (Hall IC)
23, 24 amplifier
25 anomaly detection circuit
30 ECU

The invention claimed is:

1. A position sensor comprising:
a magnet configured to move together with a moving body;
a magnetic sensor configured to detect a magnetic flux generated by the magnet;
another magnetic sensor configured to detect a magnetic flux generated by the magnet, the other magnetic sensor being different from the magnetic sensor; and
a detector, wherein:
the magnetic sensor is set so as to detect a first detection value taking a value on a locus preset in accordance with a position of the moving body, and the locus is set so that a change rate of the first detection value corresponding to change of the position of the moving body differs for each of a plurality of sections set within a movement range of the moving body;
the other magnetic sensor is set so as to detect a second detection value taking a value on a second locus preset in accordance with the position of the moving body, and the second locus is set so as to have a preset relation with the locus for each of the sections; and
the detector is configured to detect the anomaly of the magnetic sensor based on a relation between the first detection value and the second detection value.

2. The position sensor according to claim 1, wherein:
the second locus is set so that a change rate of the second detection value is substantially identical to the change rate of the first detection value for each of the sections.

3. The position sensor according to claim 1, wherein:
the second locus is set to be identical or parallel to the locus; and
the detector is configured to detect the anomaly of the magnetic sensor when a preset relation between the first detection value and the second detection value changes.

4. The position sensor according to claim 1, wherein:
the moving body is a rotating body; and
the magnetic sensor is set to detect the first detection value taking the value on the locus in accordance with a rotation angle of the rotating body, and the locus is set so that a change rate of the first detection value corresponding to change of the rotation angle of the rotating body differs for each of a plurality of sections set within a rotation range of the rotating body.

5. The position sensor according to claim 4, wherein:
as the sections, at least a range of a rotation angle in one direction with reference to a specific rotation position of the rotating body and a range of a rotation angle in a reversed rotation direction from the one direction with reference to the specific rotation position are set;
the locus and the second locus are set so that the change rate of the first detection value and the change rate of the second detection value are substantially identical for each of the sections; and
the detector is configured to detect the anomaly of the magnetic sensor based on the relation between the first detection value and the second detection value.

6. The position sensor according to claim 5, wherein
the locus and the second locus are set so as to have a change point where the change rate of the first detection value and the change rate of the second detection value change for each of the sections.

7. The position sensor according to claim 5, wherein
the second locus is set to be identical or parallel to the locus; and
the detector is configured to detect the anomaly of the magnetic sensor when a preset relation between the first detection value and the second detection value changes.

8. The position sensor according to claim 7, further comprising
a sensor configured to detect the rotation angle of the rotating body in each of the sections based on at least one of the first detection value and the second detection value.

9. The position sensor according to claim 4, wherein the rotating body is a throttle grip of a vehicle.

10. A position detection method executed by a position sensor including a magnetic sensor, the magnetic sensor detecting a magnetic flux generated by a magnet moving together with a moving body, and another magnetic sensor configured to detect a magnetic flux generated by the magnet, the other magnetic sensor being different from the magnetic sensor,
wherein:
the magnetic sensor is set so as to detect a first detection value taking a value on a locus preset in accordance with a position of the moving body, and the locus is set so that a change rate of the first detection value corresponding to change of the position of the moving body differs for each of a plurality of sections set within a movement range of the moving body;

the other magnetic sensor is set so as to detect a second detection value taking a value on a second locus preset in accordance with the position of the moving body, and the second locus is set so as to have a preset relation with the locus for each of the sections; and the second locus is set so that a change rate of the second detection value is substantially identical to the change rate of the first detection value for each of the sections, the position detection method comprising detecting an anomaly of the magnetic sensor based on a relation between the first detection value and the second detection value.

11. The position detection method according to claim 10, wherein the second locus is set so that a change rate of the second detection value is substantially identical to the change rate of the first detection value for each of the sections.

12. The position detection method according to claim 10, wherein the second locus is set to be identical or parallel to the locus, the position detection method comprising detecting the anomaly of the magnetic sensor when a preset relation between the first detection value and the second detection value changes.

* * * * *